United States Patent
Kobayashi et al.

(10) Patent No.: US 10,903,812 B2
(45) Date of Patent: Jan. 26, 2021

(54) TRAP FILTER AND FILTER CIRCUIT

(71) Applicant: Murata Manufacturing Co., Ltd., Nagaokakyo (JP)

(72) Inventors: Hideaki Kobayashi, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/542,338

(22) Filed: Aug. 16, 2019

(65) Prior Publication Data

US 2019/0372544 A1    Dec. 5, 2019

Related U.S. Application Data

(63) Continuation of application No. PCT/JP2018/007491, filed on Feb. 28, 2018.

(30) Foreign Application Priority Data

Mar. 29, 2017    (JP) .................. 2017-064120

(51) Int. Cl.
| | |
|---|---|
| *H03H 7/09* | (2006.01) |
| *H03H 7/01* | (2006.01) |
| *H01F 17/00* | (2006.01) |
| *H03H 1/00* | (2006.01) |

(52) U.S. Cl.
CPC ............. *H03H 7/09* (2013.01); *H01F 17/00* (2013.01); *H03H 7/0115* (2013.01); *H03H 7/0161* (2013.01); *H03H 7/1766* (2013.01); *H03H 7/1791* (2013.01); *H03H 2001/0085* (2013.01)

(58) Field of Classification Search
CPC ....... H03H 7/0115; H03H 7/0161; H03H 7/09
USPC .................................... 333/175, 185
See application file for complete search history.

(56) References Cited

U.S. PATENT DOCUMENTS

| | | | |
|---|---|---|---|
| 2011/0210805 A1* | 9/2011 | Link ................ | H03H 9/725 333/134 |
| 2012/0127049 A1* | 5/2012 | Kato ............... | H01P 1/20345 343/749 |
| 2015/0094009 A1 | 4/2015 | Yosui et al. | |

(Continued)

FOREIGN PATENT DOCUMENTS

| | | |
|---|---|---|
| JP | 50-72147 U | 6/1975 |
| JP | 2001-126928 A | 5/2001 |
| JP | 2015-29319 A | 2/2015 |

(Continued)

OTHER PUBLICATIONS

Official Communication issued in International Patent Application No. PCT/JP2018/007491, dated May 15, 2018.

*Primary Examiner* — Rakesh B Patel
(74) *Attorney, Agent, or Firm* — Keating & Bennett, LLP

(57) ABSTRACT

A trap filter includes a first inductor, a second inductor, and a capacitor. A first end of the first inductor extends to a first connection portion, a third end of the second inductor is connected to a second end of the first inductor, and a fourth end extends to a second connection portion. The capacitor is connected in parallel with the second inductor. The first inductor and the second inductor are subtractive-polarity coupled. An inductance value of the second inductor is less than an absolute value of mutual inductance generated by coupling of the first inductor and the second inductor.

15 Claims, 6 Drawing Sheets

(56) References Cited

U.S. PATENT DOCUMENTS

2018/0041182 A1   2/2018   Nishida et al.

FOREIGN PATENT DOCUMENTS

WO    2013/069498 A1   5/2013
WO    2016/167171 A1   10/2016

* cited by examiner

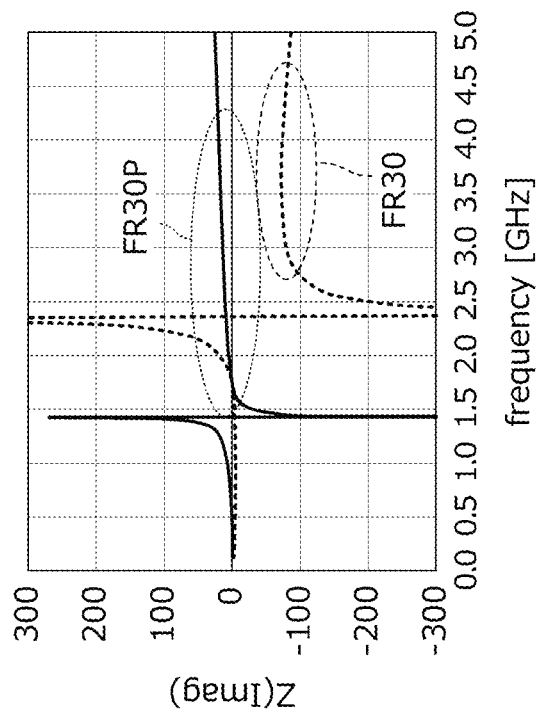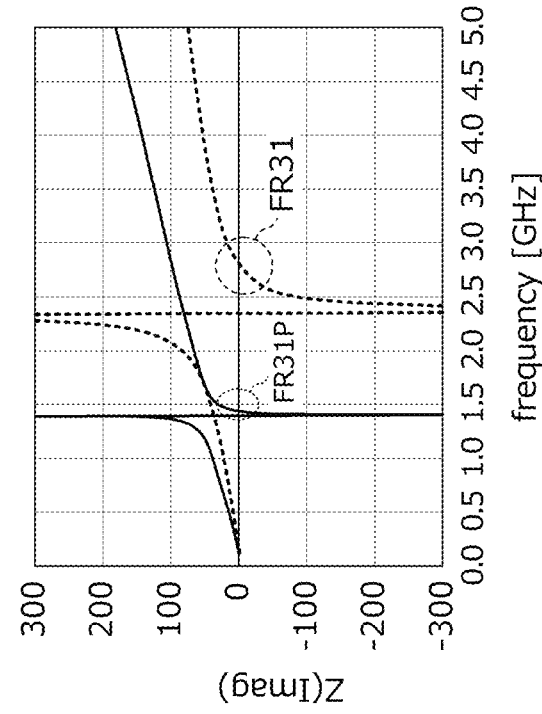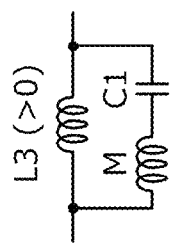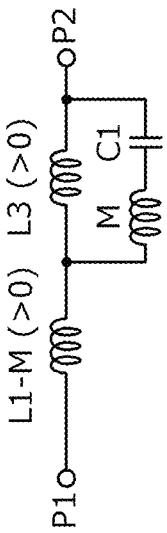
FIG. 9A
FIG. 9B

TRAP FILTER AND FILTER CIRCUIT

CROSS REFERENCE TO RELATED APPLICATIONS

This application claims the benefit of priority to Japanese Patent Application No. 2017-064120 filed on Mar. 29, 2017 and is a Continuation Application of PCT Application No. PCT/JP2018/007491 filed on Feb. 28, 2018. The entire contents of each application are hereby incorporated herein by reference.

BACKGROUND OF THE INVENTION

1. Field of the Invention

The present invention relates to a trap filter that blocks signals in an unwanted frequency band in, for example, a radio-frequency (RF) circuit that handles signals in an RF communication frequency band, and a filter circuit including the trap filter.

2. Description of the Related Art

In an RF circuit provided in a cellular phone terminal or the like, a trap filter that is equivalently short-circuited in a particular frequency band and that is equivalently open in the other frequency bands is used.

In addition, Japanese Unexamined Patent Application Publication No. 2015-29319 describes that a trap filter is provided by adding a simple LC parallel resonant circuit to a signal line.

A simple LC parallel resonant circuit has a large change in reactance to a frequency change near its resonant frequency. Thus, a trap filter including a simple LC parallel resonant circuit has a narrow frequency range having short-circuited characteristics. For that reason, the stopband is generally narrow.

To widen the stopband of a trap filter, for example, a plurality of trap filters with different stopbands may be combined. This, however, causes the entire circuit configuration to be complicated and increased in size.

SUMMARY OF THE INVENTION

Preferred embodiments of the present invention provide trap filters that each achieve a widened stopband without making the circuit configuration complicated, and filter circuits each including such a trap filter.

A trap filter according to a preferred embodiment of the present application includes a first inductor, a second inductor, and a capacitor. The first inductor includes a first end and a second end, and the first end extends to a first connection portion. The second inductor includes a third end and a fourth end. The third end is connected to the second end of the first inductor, and the fourth end extends to a second connection portion. The capacitor is connected in parallel with the second inductor.

The first inductor and the second inductor are subtractive-polarity coupled (coupled to generate negative mutual inductance). An inductance value of the second inductor is less than an absolute value of mutual inductance generated by coupling of the first inductor and the second inductor.

In a trap filter with a conventional configuration, a change in reactance to a frequency change near its resonant frequency is large, that is, a frequency range where the reactance is 0 (=shorted) is narrow. In contrast, according to the above-described configuration, the circuit configuration includes a series LC circuit including an inductor defined by the mutual inductance and the capacitor, and the composite inductance of the second inductor and an inductor defined by the negative mutual inductance resonate in parallel. Accordingly, a change in reactance to a frequency change becomes more moderate than that in a simple LC resonant circuit, and a frequency band where the reactance is near 0 (=shorted) is wide. That is, a wide stopband is achieved.

It is preferable that the inductance of the second inductor is less than the inductance of the first inductor. This makes it easy to obtain negative composite inductance of the second inductor and the inductor defined by the negative mutual inductance. In short, it is not necessary to increase the coupling coefficient between the first inductor and the second inductor as much in order to increase the absolute value of the mutual inductance.

A series LC resonant circuit including an inductor defined by the mutual inductance and the capacitor has a single resonant frequency. That is, the stopband is not made wider by resonation at two or more different frequencies.

It is preferable that the first inductor and the second inductor are provided in a single multilayer substrate, and the capacitor is mounted on the multilayer substrate. With this configuration, the component is reduced in size, and an area occupied by the component on a circuit substrate is decreased.

A filter circuit according to a preferred embodiment of the present invention includes a bandpass filter connected in series between a first port and a second port, and a trap filter connected in shunt between the second port and ground. The trap filter includes a first inductor, a second inductor, and a capacitor. The first inductor includes a first end and a second end, and the first end extends to a first connection portion. A second inductor includes a third end and a fourth end; the third end is connected to the second end of the first inductor; and the fourth end extends to a second connection portion. The capacitor is connected in parallel with the second inductor.

The first inductor and the second inductor are subtractive-polarity coupled (coupled to generate negative mutual inductance). An inductance value of the second inductor is less than an absolute value of mutual inductance generated by coupling of the first inductor and the second inductor.

According to the above-described configuration, a filter circuit having blocking characteristics over a wide band is obtained.

A filter circuit according to a preferred embodiment of the present invention includes ports for signals in a plurality of frequency bands, and the filter circuit filters signals in the plurality of frequency bands. The filter circuit includes a trap filter that causes, among the ports for signals in the plurality of frequency bands, a certain port to attenuate a transmission signal band of another communication frequency band. The trap filter includes a first inductor, a second inductor, and a capacitor. The first inductor includes a first end and a second end, and the first end extends to a first connection portion. A second inductor includes a third end and a fourth end; the third end is connected to the second end of the first inductor; and the fourth end extends to a second connection portion. The capacitor is connected in parallel with the second inductor.

The first inductor and the second inductor are subtractive-polarity coupled (coupled to generate negative mutual inductance). An inductance value of the second inductor is less than an absolute value of mutual inductance generated by coupling of the first inductor and the second inductor.

For example, in the case where the filter circuit is applied to a front-end circuit in a communication circuit compatible with carrier aggregation that performs simultaneous transmission or reception in a plurality of frequency bands, the filter circuit becomes a circuit that bundles many filters. In such a filter circuit, according to the above-described configuration, a transmission signal in another band is able to be attenuated by the above-described trap filter.

According to preferred embodiments of the present invention, trap filters each having a widened stopband without making the circuit configuration complicated, and filter circuits including the same are obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9A is a diagram illustrating a parallel circuit of a series LC circuit including an inductor (M) and a capacitor C1, and an inductor L3, in a trap filter of a comparative example, and frequency characteristics of the reactance thereof. FIG. 9B is a diagram illustrating the equivalent circuit of the trap filter which is the comparative example, and the frequency characteristics of the reactance thereof.

DETAILED DESCRIPTION OF THE PREFERRED EMBODIMENTS

Figure 1A:
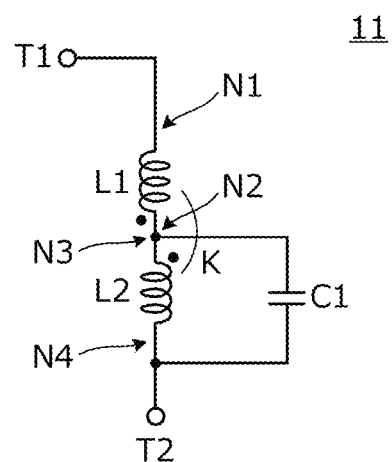
FIG. 1A is a circuit diagram of a trap filter 11 according to a first preferred embodiment of the present invention.

Hereinafter, preferred embodiments of the present invention will be described with reference to specific examples and the accompanying drawings. In the drawings, the same or corresponding portions are denoted by the same reference numeral. Considering the ease of description or understanding of main points, the preferred embodiments will be described separately. However, configurations described in different preferred embodiments may be partially replaced or combined. From a second preferred embodiment onward, descriptions of points that are common to those of a first preferred embodiment will be omitted, and only different points will be described. In particular, the same or similar advantageous effects achieved by the same or similar configurations will not be described in each of the preferred embodiments.

First Preferred Embodiment

Figure 1B:
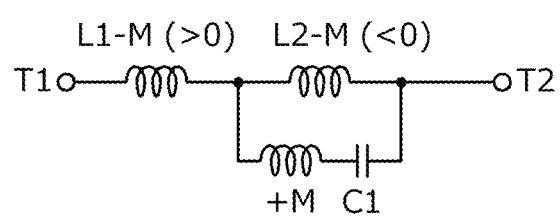
FIG. 1B is an equivalent circuit diagram of the trap filter 11.
Figure 1C:
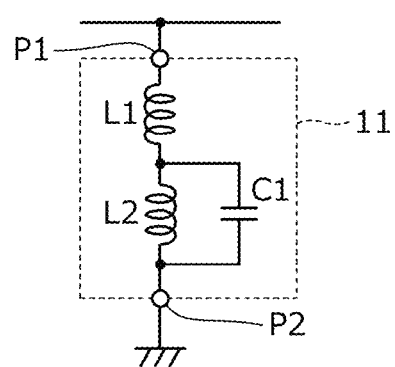
FIG. 1C is a diagram illustrating a connection example of the trap filter 11 to a signal line.

FIG. 1A is a circuit diagram of a trap filter 11 according to a first preferred embodiment of the present invention, and FIG. 1B is an equivalent circuit diagram of the trap filter 11. FIG. 1C is a diagram illustrating a connection example of the trap filter 11 to a signal line.

As illustrated in FIG. 1A, the trap filter 11 includes a first inductor L1, a second inductor L2, and a capacitor C1. The first inductor L1 includes a first end N1 and a second end N2, and the first end N1 extends to a first connection portion T1. The second inductor includes a third end N3 and a fourth end N4. The third end N3 is connected to the second end N2 of the first inductor, and the fourth end N4 extends to a second connection portion T2. The capacitor C1 is connected in parallel with the second inductor L2.

The first inductor L1 and the second inductor L2 are coupled such that negative mutual inductance is generated. That is, the first inductor L1 and the second inductor L2 are subtractive-polarity coupled. The inductance value of the second inductor L2 is less than the absolute value M of mutual inductance generated by coupling of the first inductor L1 and the second inductor L2. Here, when the inductance of the first inductor L1 is denoted by L1, the inductance of the second inductor L2 is denoted by L2, and the mutual inductance is denoted by M, the relationships L1>L2 and L2<M hold true.

The mutually-coupled first inductor L1 and second inductor L2 are equivalently represented by three inductors, as illustrated in FIG. 1B.

In FIG. 1B, an inductor (L1−M) is defined by the inductance of the first inductor L1 and the mutual inductance M, and an inductor (L2−M) is defined by the inductance of the second inductor L2 and the mutual inductance M. In addition, an inductor (+M) corresponds to the mutual inductance M. Here, when the inductance of the first inductor L1 is denoted by L1, the inductance of the second inductor L2 is denoted by L2, and the mutual inductance is denoted by M, (L1−M) is positive inductance, and (L2−M) is negative inductance.

The trap filter 11 is equivalently a circuit in which, as illustrated in FIG. 1B, the inductor (L1−M) is connected in series to a parallel circuit of a series LC circuit including the inductor (M) and the capacitor C1, and the inductor (L2−M).

Because the inductance of the second inductor L2 is less than the inductance of the first inductor L1, the composite inductance of the second inductor L2 and the negative mutual inductance −M are able to be easily made negative. That is, it is not necessary to increase the coupling coefficient between the first inductor L1 and the second inductor L2 in order to increase the absolute value of the mutual inductance.

The trap filter 11 is connected in shunt between a signal line and ground, as illustrated in FIG. 1C.

Hereinafter, the characteristics of the trap filter 11 will be described using the equivalent circuit diagram of the trap filter 11.

Figure 2A:
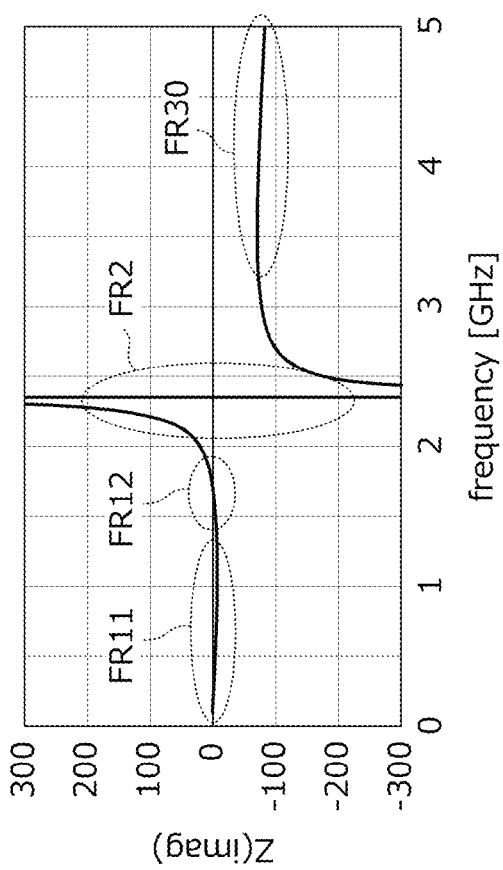
FIG. 2A is a diagram illustrating a parallel circuit of a series LC circuit including an inductor (M) and a capacitor C1, and an inductor (L2−M), and frequency characteristics of the reactance thereof.
Figure 2B:
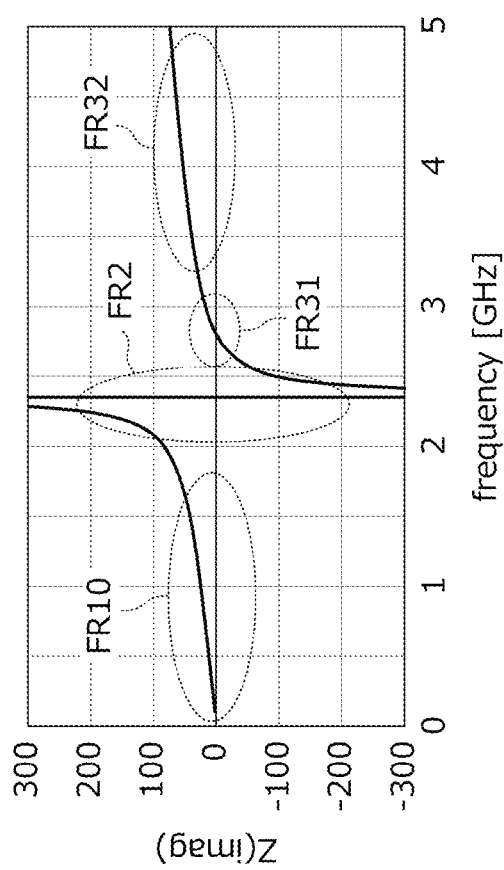
FIG. 2B is a diagram illustrating the equivalent circuit of the trap filter 11, and the frequency characteristics of the reactance thereof.

FIG. 2A is a diagram illustrating a parallel circuit that includes a series LC circuit including the inductor (M) and capacitor C1, and the inductor (L2−M), and frequency characteristics of its reactance. FIG. 2B is a diagram illustrating the equivalent circuit of the trap filter 11, and the frequency characteristics of its reactance. Here, each element constant is as below.

L1=about 7.5 nH
L2=about 1.3 nH
C1=about 3.5 pF
M≅about 2.5 nH (coupling coefficient k=about 0.8)

In FIG. 2A, a frequency range FR11 is a range where the reactance of the capacitor C1 is large, and accordingly, the reactance of the inductor (L2−M) is dominant. In this frequency range, the reactance of the parallel circuit is 0 or substantially 0.

In FIG. 2A, a frequency range FR12 is a range where the reactance of the series LC circuit including the inductor (M) and the capacitor C1 is dominant. That is, the higher the frequency, the more the reactance of the parallel circuit increases in the positive direction.

In FIG. 2A, a frequency range FR2 is a range where the positive reactance of the series LC circuit including the inductor (M) and the capacitor C1 and the negative reactance of the inductor (L2−M) are balanced (resonate in parallel). In this range, no current flows between two ends of the parallel circuit.

In FIG. 2A, a frequency range FR30 is a range where the reactance of the inductor (M) is larger, and the negative inductance component of the inductor (L2−M) is dominant. In short, the reactance remains in the negative range, and the higher the frequency, the more the reactance becomes negative.

In FIG. 2B, a frequency range FR10 is a range where characteristics mainly due to the inductance of the inductor (L1−M) occur. That is, the higher the frequency, the more the reactance of the trap filter 11 increases in the positive direction.

In FIG. 2B, similar to the frequency range FR2 illustrated in FIG. 2A, the frequency range FR2 is a range where the positive reactance of the series LC circuit including the inductor (M) and the capacitor C1 and the negative reactance of the inductor (L2−M) are balanced (resonate in parallel).

In FIG. 2B, a frequency range FR31 is a range where, as a result of the addition of the positive inductance of the inductor (L1−M) to the negative inductance component of the inductor (L2−M) which is dominant in the above-described parallel circuit, the reactance of the trap filter 11 is near 0. This frequency range operates as a stopband.

Note that, in FIG. 2B, a frequency range FR32 is a range where characteristics due to the composite inductance of the inductors (L1−M), (L2−M), and (M) occur. That is, the higher the frequency, the more the reactance of the trap filter 11 increases in the positive direction.

Here, the characteristics of a trap filter of a comparison target will be exemplified.

FIG. 9A is a diagram illustrating a parallel circuit of a series LC circuit including an inductor (M) and a capacitor C1, and an inductor L3, in a trap filter of a comparative example, and frequency characteristics of its reactance. The inductance of the inductor L3 is positive. FIG. 9B is a diagram illustrating the equivalent circuit of the trap filter which is the comparative example, and the frequency characteristics of its reactance. This trap filter is a circuit in which the inductor (L1−M) with positive inductance is connected in series to the parallel circuit illustrated in FIG. 9A. Here, each element constant is as below.

L1=about 7.5 nH
L3=about 1.2 nH
C1=about 3.5 pF
M≅about 2.5 nH

In FIG. 9A, a frequency range FR30P is a range where mainly the inductance component of the inductor L3 is dominant. That is, the higher the frequency, the more the reactance of the parallel circuit increases in the positive direction. In FIG. 9A, a range corresponding to the frequency range FR30 illustrated in FIG. 2A is represented by a broken line.

In FIG. 9B, a frequency range FR31P is a range where the reactance of the trap filter of the comparative example is near 0. This frequency range operates as a stopband.

Because the inductance of the inductor L3 in the trap filter of the comparative example is positive, the characteristics that the reactance becomes negative due to the operation of the negative inductor (L2−M) in the trap filter 11 of the present preferred embodiment do not occur. That is, in the case where the inductor L3 and the inductor (M) in the parallel circuit have the same sign, there is no exchange of energy, and there is no frequency range where the negative inductance increases in the parallel circuit. For that reason, the frequency range where the reactance is near 0 in the trap filter of the comparative example is narrow. In FIG. 9B, a range corresponding to the frequency range FR31 illustrated in FIG. 2B is represented by a broken line.

Figure 3A:
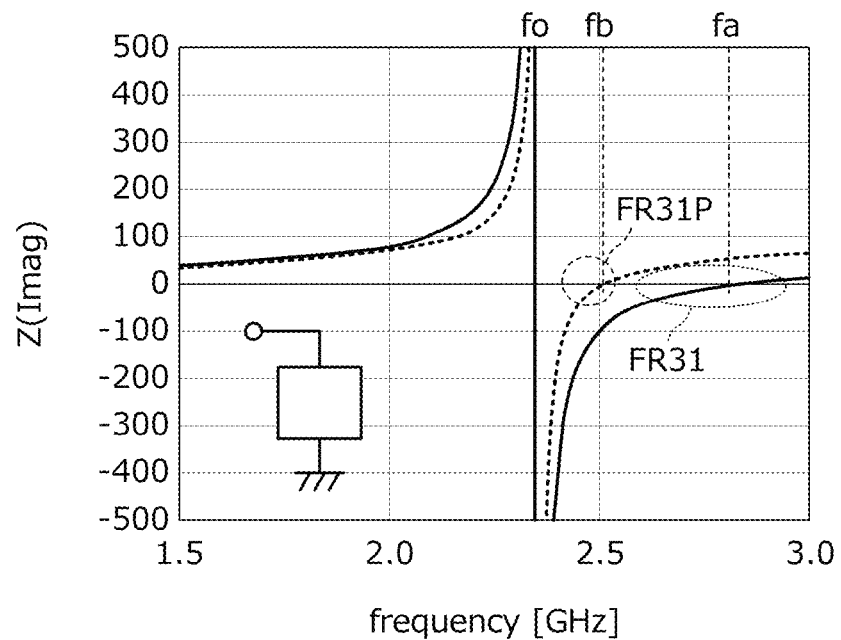
FIG. 3A is a diagram illustrating the frequency characteristics of reactance of the trap filter 11 when the trap filter 11 is viewed as a 1-port circuit.
Figure 3B:
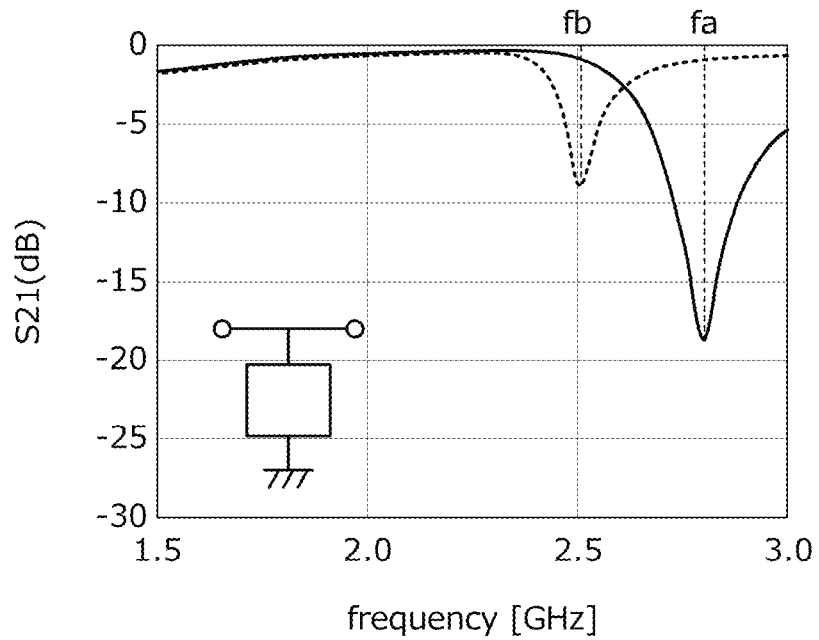
FIG. 3B is a diagram illustrating the frequency characteristics of insertion loss of a 2-port circuit in which the trap filter 11 is connected in shunt between the signal line and ground.

FIG. 3A is a diagram illustrating the frequency characteristics of reactance of the trap filter 11 when the trap filter 11 is viewed as a 1-port circuit. FIG. 3B is a diagram illustrating the frequency characteristics of insertion loss of a 2-port circuit in which the trap filter 11 is connected in shunt between the signal line and ground.

In FIGS. 3A and 3B, solid lines represent the characteristics of the trap filter 11, and broken lines represent the characteristics of the trap filter of the comparative example in which the negative inductor (L2−M) in the trap filter 11 is replaced with a positive capacitor (the negative reactance is represented by a capacitor). The capacitance of the positive capacitor is defined such that the parallel resonant frequency of the trap filter of the comparative example matches the parallel resonant frequency of the trap filter 11 of the present preferred embodiment.

Regarding the trap filter 11 of the present preferred embodiment, as illustrated in FIG. 3A, the reactance is 0 or substantially 0 at frequency fa, and, as illustrated in FIG. 3B, the stopband characteristics whose center frequency is frequency fa occur. Regarding the trap filter of the comparative example, as illustrated in FIG. 3A, the reactance is 0 or substantially 0 at frequency fb, and, as illustrated in FIG. 3B, the stopband characteristics whose center frequency is frequency fb occur.

Compared with the comparative example, because the trap filter 11 of the present preferred embodiment has a wider frequency range where its reactance is 0 or near 0, the stopband also becomes wider. Compared with the comparative example, in the trap filter 11 of the present preferred embodiment, a frequency range where its reactance is 0 or near 0 is spaced away from parallel resonant frequency fo. The frequency characteristics of the resistance of a trap filter are such characteristics that the resistance becomes a maximum at the parallel resonant frequency, and becomes smaller as the resistance moves away from that frequency. As described above, because the frequency range where the reactance is 0 or near 0 is spaced away from parallel resonant frequency fo, the resistance in the frequency range FR31 is small. For that reason, attenuation in the frequency range FR31 is greater than that in the comparative example.

As described above, the trap filter 11 of the present preferred embodiment has a wider stopband and greater attenuation than a conventional simple LC parallel resonant circuit.

In the trap filter 11 of the present preferred embodiment, the series LC resonant circuit including the mutual inductance M and the capacitor C1 has a single resonant frequency. That is, since the trap filter 11 is not one in which the stopband is made wider by providing a plurality of resonant circuits that resonate at two or more different frequencies, the trap filter 11 is able to be configured with a small number of elements, and reductions in the size and occupancy area thereof are able to be achieved.

Second Preferred Embodiment

Figure 4:
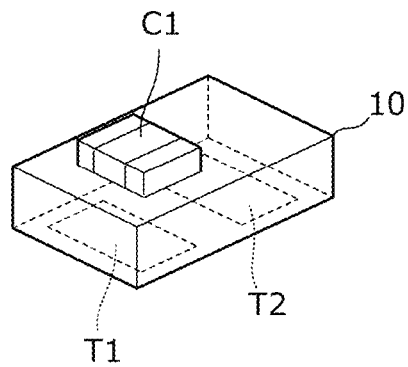
FIG. 4 is a perspective view of a trap filter 11 according to a second preferred embodiment of the present invention.
Figure 5:
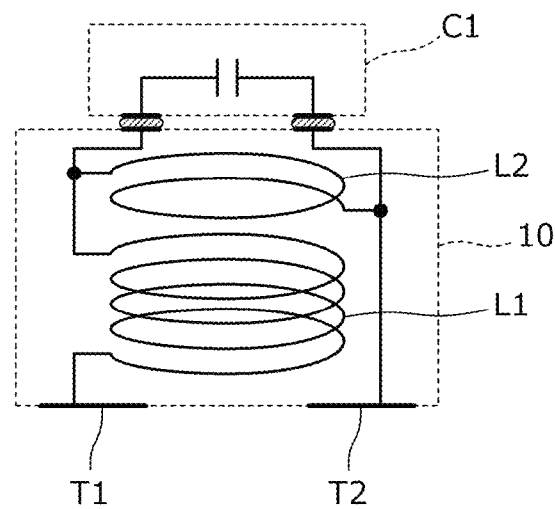
FIG. 5 is a schematic diagram illustrating the internal configuration of the trap filter 11 according to the second preferred embodiment of the present invention.

In a second preferred embodiment of the present invention, a trap filter defined by a single component will be described. FIG. 4 is a perspective view of the trap filter 11 according to the present preferred embodiment. FIG. 5 is a schematic diagram illustrating the internal configuration of the trap filter 11.

The trap filter 11 includes a multilayer substrate 10, and a chip capacitor C1 mounted on the multilayer substrate 10. In the multilayer substrate 10, the first inductor L1 and the second inductor L2 illustrated in FIG. 1A are provided. In addition, mounting terminals T1 and T2 are provided on the bottom surface of the multilayer substrate 10. Pads for connecting the chip capacitor C1 are provided on the top surface of the multilayer substrate 10, and the chip capacitor C1 is connected to these pads.

As illustrated in FIG. 5, a coil conductor pattern defining the first inductor L1 and a coil conductor pattern defining the second inductor L2 are provided in the multilayer substrate 10. Both of these coil conductor patterns are preferably helical, and are arranged coaxially.

According to the present preferred embodiment, the trap filter 11 is able to be surface-mounted as a single component on a circuit substrate. In addition, because the component is able to be reduced in size, an area occupied by the component on the circuit substrate is reduced.

Note that an electrode defining the capacitor C1 may preferably be provided in the multilayer substrate 10 so as to be integrated. Alternatively, a chip capacitor defining the capacitor C1 may be embedded in the multilayer substrate 10.

Third Preferred Embodiment

In a third preferred embodiment of the present invention, an example of a filter circuit including the trap filter 11 discussed in the first and second preferred embodiments will be described.

Figure 6:
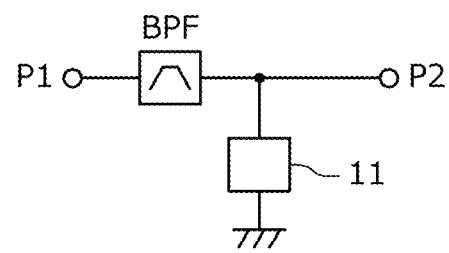
FIG. 6 is a circuit diagram of a filter circuit 21 according to a third preferred embodiment of the present invention.

FIG. 6 is a circuit diagram of a filter circuit 21. The filter circuit 21 includes a bandpass filter BPF connected in series between a first port P1 and a second port P2, and the trap filter 11 connected in shunt between the second port P2 and ground. The trap filter 11 is the trap filter 11 described in the first and second preferred embodiments. The bandpass filter BPF is preferably, for example, a SAW filter.

Figure 7:
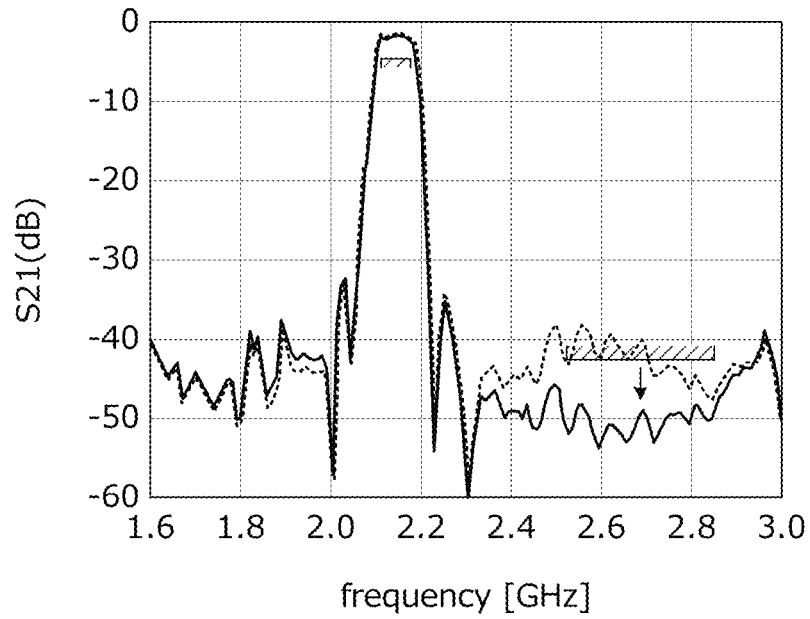
FIG. 7 is a diagram illustrating the frequency characteristics of insertion loss of the filter circuit 21 according to the third preferred embodiment of the present invention.

FIG. 7 is a diagram illustrating the frequency characteristics of insertion loss of the filter circuit 21 of the present preferred embodiment. In FIG. 7, a solid line represents the characteristics of the filter circuit 21 of the present preferred embodiment, and a broken line represents the characteristics of a filter circuit in the case where the trap filter 11 is not provided.

In FIG. 7, the passband characteristics centered at about 2.15 GHz are due to the characteristics of the bandpass filter BPF illustrated in FIG. 6. In addition, the attenuation characteristics greater than or equal to about 2.5 GHz and less than or equal to about 2.85 GHz are due to the characteristics of the trap filter 11 illustrated in FIG. 6.

The filter circuit 21 illustrated in FIG. 6 is used to enable, for example, a reception signal in a certain band to pass, and is able to greatly attenuate an unwanted transmission signal that occurs and enters the filter circuit 21.

Note that the SAW filter defining the bandpass filter BPF and the trap filter 11 illustrated in FIG. 6 may preferably be integrated as a single component. For example, as illustrated in FIGS. 4 and 5, the first inductor L1 and the second inductor L2 may be provided in the multilayer substrate, and the capacitor C1 and the SAW filter chip may preferably be mounted on the multilayer substrate.

Fourth Preferred Embodiment

In a fourth preferred embodiment of the present invention, an example of a filter circuit including the trap filter 11 described in the first and second preferred embodiments will be discussed.

Figure 8:
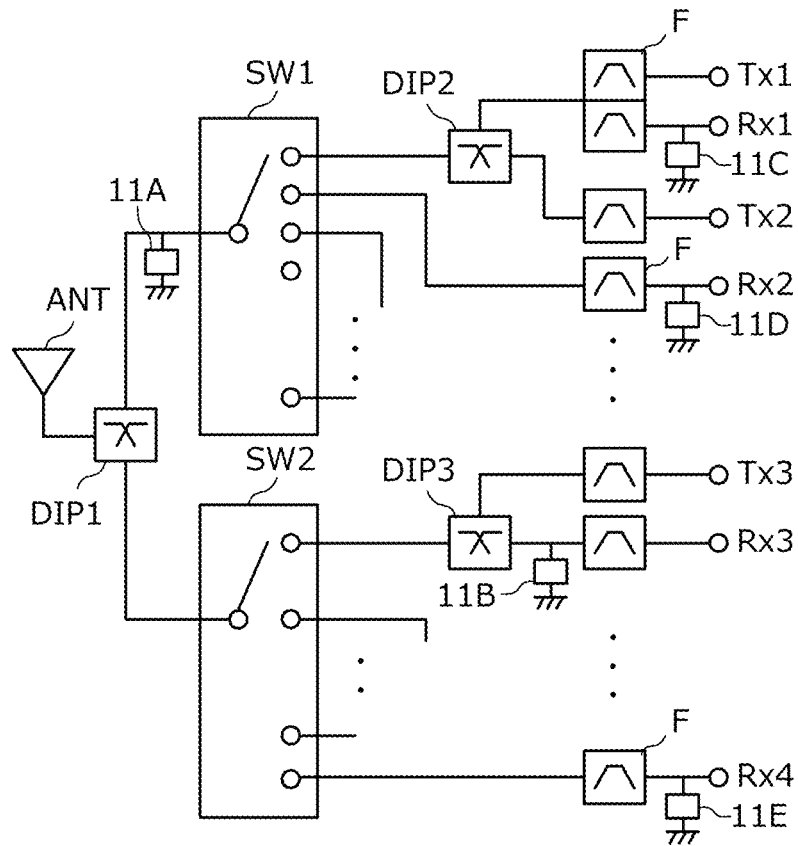
FIG. 8 is a circuit diagram of a filter circuit 22 according to a fourth preferred embodiment of the present invention.

FIG. 8 is a circuit diagram of a filter circuit 22 according to the fourth preferred embodiment. The filter circuit 22 is a front-end circuit connected between an antenna ANT and a transmission/reception circuit. The filter circuit 22 includes diplexers DIP1, DIP2, and DIP3, RF switches SW1 and SW2, bandpass filters F, and trap filters 11A, 11B, 11C, 11D, and 11E. In this example, the trap filter 11A is connected subsequent to the diplexer DIP1, and the trap filter 11B is connected subsequent to the diplexer DIP3. In addition, the trap filters 11C, 11D, and 11E are connected to output ports (reception ports) Rx1, Rx2, and Rx4, respectively, of reception signals.

The filter circuit 22 is applied to a communication circuit compatible with carrier aggregation that performs simultaneous transmission or reception in a plurality of frequency bands. The filter circuit 22 bundles many filters. In such a filter circuit, the trap filter 11 attenuates a transmission signal in another band (power of a transmission signal that comes around and gets in) different from a reception signal in a communication band using a reception port.

Although the examples in which the first inductor L1 and the second inductor L2 are provided in the multilayer substrate, and the capacitor C1 and the SAW filter chip are mounted on the multilayer substrate have been described in the above-described preferred embodiments, a composite filter such as a duplexer and a circulator may be mounted on the multilayer substrate as a single component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A trap filter comprising:
a first inductor including a first end and a second end, the first end extending to a first connection portion;

a second inductor including a third end and a fourth end, the third end being connected to the second end of the first inductor, the fourth end extending to a second connection portion; and a capacitor connected in parallel to the second inductor; wherein the first inductor and the second inductor are subtractive-polarity coupled;

an inductance value of the second inductor is less than an absolute value of mutual inductance generated by coupling of the first inductor and the second inductor; and the inductance value of the second inductor is less than an inductance value of the first inductor.

2. The trap filter according to claim 1, wherein a series LC resonant circuit including the mutual inductance and the capacitor has a single resonant frequency.

3. The trap filter according to claim 1, wherein the first inductor and the second inductor are provided in a single multilayer substrate, and the capacitor is mounted on the multilayer substrate.

4. The trap filter according to claim 3, wherein the first inductor is defined by a first coil conductor pattern, and the second inductor is defined by a second coil conductor pattern.

5. The trap filter according to claim 4, wherein each of the first and second coil conductor patterns is helical and coaxially disposed in the multilayer substrate.

6. A filter circuit comprising:

a bandpass filter connected in series between a first port and a second port, and a trap filter connected in shunt between the second port and ground; wherein the trap filter includes:

a first inductor including a first end and a second end, the first end extending to a first connection portion;

a second inductor including a third end and a fourth end, the third end being connected to the second end of the first inductor, the fourth end extending to a second connection portion; and a capacitor connected in parallel to the second inductor;

the first inductor and the second inductor are subtractive-polarity coupled;

an inductance value of the second inductor is less than an absolute value of mutual inductance generated by coupling of the first inductor and the second inductor; and the inductance value of the second inductor is less than an inductance value of the first inductor.

7. The filter circuit according to claim 6, wherein a series LC resonant circuit including the mutual inductance and the capacitor has a single resonant frequency.

8. The filter circuit according to claim 6, wherein the first inductor and the second inductor are provided in a single multilayer substrate, and the capacitor is mounted on the multilayer substrate.

9. The filter circuit according to claim 8, wherein the first inductor is defined by a first coil conductor pattern, and the second inductor is defined by a second coil conductor pattern.

10. The filter circuit according to claim 9, wherein each of the first and second coil conductor patterns is helical and coaxially disposed in the multilayer substrate.

11. A filter circuit including ports for signals in a plurality of frequency bands, the filter circuit filtering signals in the plurality of frequency bands, the filter circuit comprising:

a trap filter that causes, among the ports for signals in the plurality of frequency bands, a certain port to attenuate a transmission signal band of another communication frequency band; wherein the trap filter includes:

a first inductor including a first end and a second end, the first end extending to a first connection portion;

a second inductor including a third end and a fourth end, the third end being connected to the second end of the first inductor, the fourth end extending to a second connection portion; and a capacitor connected in parallel to the second inductor;

the first inductor and the second inductor are subtractive-polarity coupled;

an inductance value of the second inductor is less than an absolute value of mutual inductance generated by coupling of the first inductor and the second inductor; and the inductance value of the second inductor is less than an inductance value of the first inductor.

12. The filter circuit according to claim 11, wherein a series LC resonant circuit including the mutual inductance and the capacitor has a single resonant frequency.

13. The filter circuit according to claim 11, wherein the first inductor and the second inductor are provided in a single multilayer substrate, and the capacitor is mounted on the multilayer substrate.

14. The filter circuit according to claim 13, wherein the first inductor is defined by a first coil conductor pattern, and the second inductor is defined by a second coil conductor pattern.

15. The filter circuit according to claim 14, wherein each of the first and second coil conductor pattern is helical and coaxially disposed in the multilayer substrate.

* * * * *